United States Patent
Sohn et al.

(10) Patent No.: US 7,143,303 B2
(45) Date of Patent: Nov. 28, 2006

(54) MEMORY DEVICE FOR COMPENSATING FOR A CLOCK SKEW CAUSING A CENTERING ERROR AND A METHOD FOR COMPENSATING FOR THE CLOCK SKEW

(75) Inventors: Young-Soo Sohn, Seoul (KR); Chan-Kyung Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 397 days.

(21) Appl. No.: 10/804,530

(22) Filed: Mar. 19, 2004

(65) Prior Publication Data
US 2005/0044441 A1   Feb. 24, 2005

(30) Foreign Application Priority Data
Aug. 22, 2003  (KR)  ........................ 10-2003-0058251

(51) Int. Cl.
*G06F 1/04*  (2006.01)
(52) U.S. Cl. ........................ 713/503; 713/400; 713/600
(58) Field of Classification Search ................ 713/400, 713/503, 600
See application file for complete search history.

(56) References Cited

U.S. PATENT DOCUMENTS

| | | | | |
|---|---|---|---|---|
| 5,935,257 A | * | 8/1999 | Nishimura | ................. 713/503 |
| 6,121,815 A | * | 9/2000 | Terada et al. | ................ 327/292 |
| 6,622,255 B1 | * | 9/2003 | Kurd et al. | .................. 713/503 |
| 6,738,922 B1 | * | 5/2004 | Warwar et al. | ............. 713/503 |
| 7,046,060 B1 | * | 5/2006 | Minzoni et al. | ............. 327/158 |
| 7,076,377 B1 | * | 7/2006 | Kim et al. | ..................... 702/66 |

* cited by examiner

*Primary Examiner*—Thomas Lee
*Assistant Examiner*—Mark Connolly
(74) *Attorney, Agent, or Firm*—F. Chau & Associates, LLC

(57) ABSTRACT

The present invention comprises a memory device for compensating for a clock skew that generates a centering error, and a method of compensating for the clock skew. To compensate for a clock skew that causes a centering error between an external clock signal and an output data signal, the memory device includes a phase detector (PD) and an up-down counter. The PD detects a phase difference between the output data signal and the external clock signal and generates an up signal or a down signal depending on the detected phase difference. The up-down counter is enabled by a calibration signal that directs a compensation of the skew and generates an offset code in response to the up signal or the down signal. The offset code is fed back to a delay locked loop (DLL) circuit and aligns the middle points of the output data signal with the edges of the external clock signal.

14 Claims, 7 Drawing Sheets

MEMORY DEVICE FOR COMPENSATING FOR A CLOCK SKEW CAUSING A CENTERING ERROR AND A METHOD FOR COMPENSATING FOR THE CLOCK SKEW

BACKGROUND OF THE INVENTION

1. Technical Field

The present invention relates to a semiconductor memory device, and more particularly, to a semiconductor memory device including a delay locked loop (DLL), which compensates for a clock skew that causes a centering error between an external clock signal and an output data signal, and a method of compensating for the clock skew.

2. Discussion of the Related Art

Increases in the speed of a computer system's bus to 100 MHz or greater are resulting in changes to existing clock transmission techniques. In particular, clock transmission techniques have recently changed from common clock transfer techniques to source synchronous transfer techniques.

Figure 1:
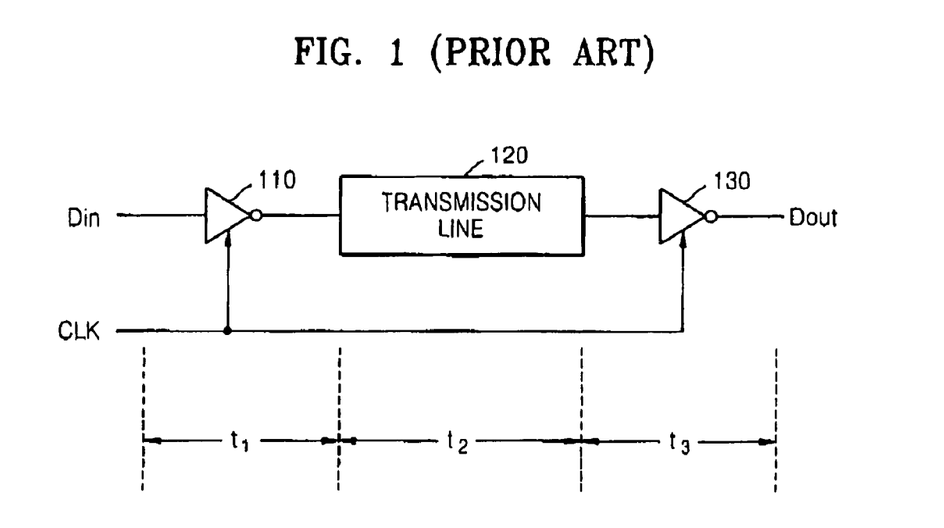
FIG. 1 illustrates a common clock transfer technique.

FIG. 1 illustrates a common clock transfer technique. Referring to FIG. 1, a clock signal CLK is produced separately from a data signal Din and is provided to a driver 110 via a path different than the data signal Din's path. The driver 110 transmits the data signal Din in response to the clock signal CLK, and a receiver 130 receives the data signal Din in response to the clock signal CLK.

Figure 2:
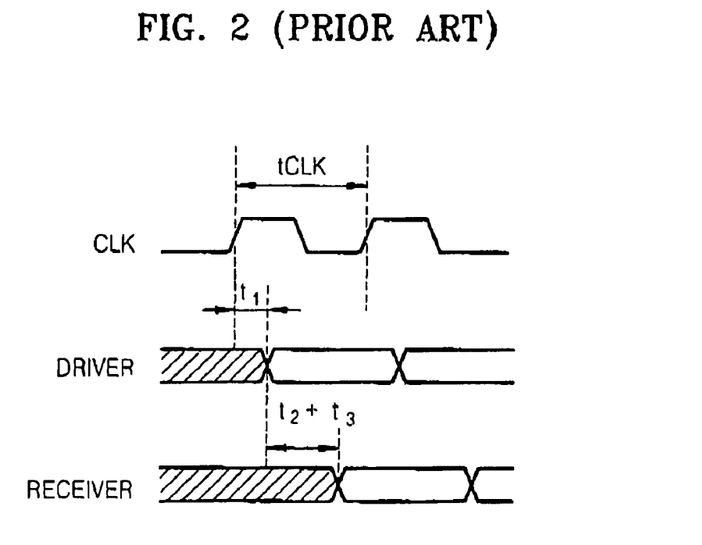
FIG. 2 is a timing diagram of the common clock transfer technique of FIG. 1.

FIG. 2 is a timing diagram of the common clock transfer technique of FIG. 1. Referring to FIG. 2, data is transmitted to the driver 110 at a first delay time (t1) after a clock edge of the clock signal CLK transitions, and the receiver 130 receives data at a sum of a second delay time (t2) and a third delay time (t3) after the time period for transmitting data to the driver 110. The first delay time (t1) denotes a period of time delayed by the driver 110, the second delay time (t2) denotes a period of time delayed while data is passing through a transmission line 120, and the third delay time (t3) denotes a period of time delayed by the receiver 130.

In the common clock transfer technique, a minimum clock period tCLKmin for synchronizing data reception with the clock signal CLK is defined in Equation 1:

$$t_{CLKmin} = t1 + t2 + t3 \quad (1)$$

Figure 3:
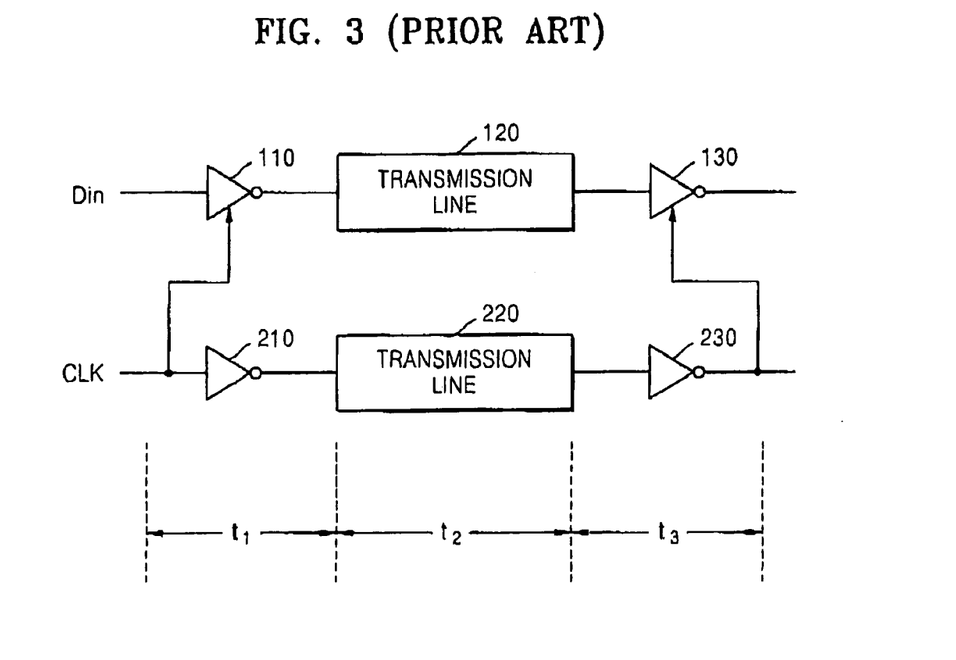
FIG. 3 illustrates a source synchronous transfer technique.
Figure 4:
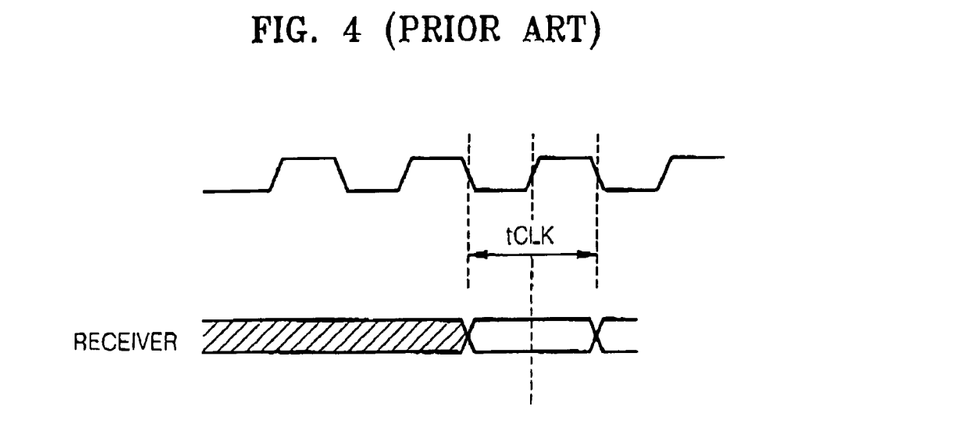
FIG. 4 is a timing diagram of the source synchronous transfer technique of FIG. 3.

In the common clock transfer technique, one cannot speed up the clock CLK under the minimum clock period tCLKmin. To reduce the time t2 of the minimum clock period tCLKmin, a source synchronous transfer technique (shown in FIG. 3) has been recently introduced. Referring to FIG. 3, a transmission line 120 is installed on a data path and, a transmission line 220 is installed on a clock path. As a result, the time t2 is removed from the minimum clock period tCLKmin, thus reducing the timing uncertainty caused by the transmission line 120. As shown in FIG. 4, data received by the receiver 130 is synchronized with a clock edge of the clock signal CLK.

In FIG. 4, the clock signal CLK is supplied to internal circuits (connected to the configuration of FIG. 3) via clock buffers 210 and 230 in synchronization with the internal circuit's clocks. The delay times t1 and t3 required for the clock signal CLK to pass through the clock buffers 210 and 230 cause a clock skew, which impedes fast data transmission. To remove the clock skew, a phase locked loop (PLL) or DLL circuit is used. The PLL or DLL circuit generates a clock signal that offsets a delay time that is generated by a clock signal input buffer or a clock signal output buffer. The PLL or DLL circuit outputs data synchronous to the clock signal via the clock signal output buffer, so that the clock signal and the output data are synchronized with each other.

Figure 5:
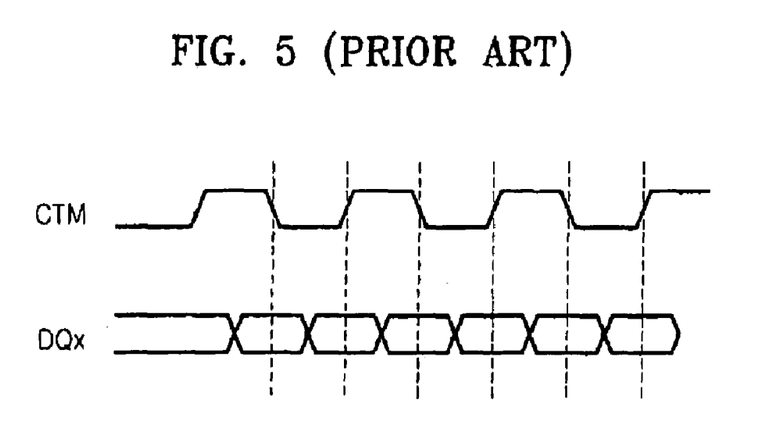
FIG. 5 is a timing diagram illustrating a data transmission technique for Rambus dynamic random access memories (RDRAMs)

Synchronous memory devices, for example, synchronous dynamic random access memories (SDRAMs), are designed so that edges of the clock signal are synchronized with those of the data output from a DLL circuit. Particularly, packet-based DRAMs such as Rambus DRAMs (hereinafter, referred to as RDRAMs) are designed so that data sampling based on a clock-to-master (CTM) clock signal can occur at the middle point of a data transmission period of time (as shown in FIG. 5).

Figure 6:
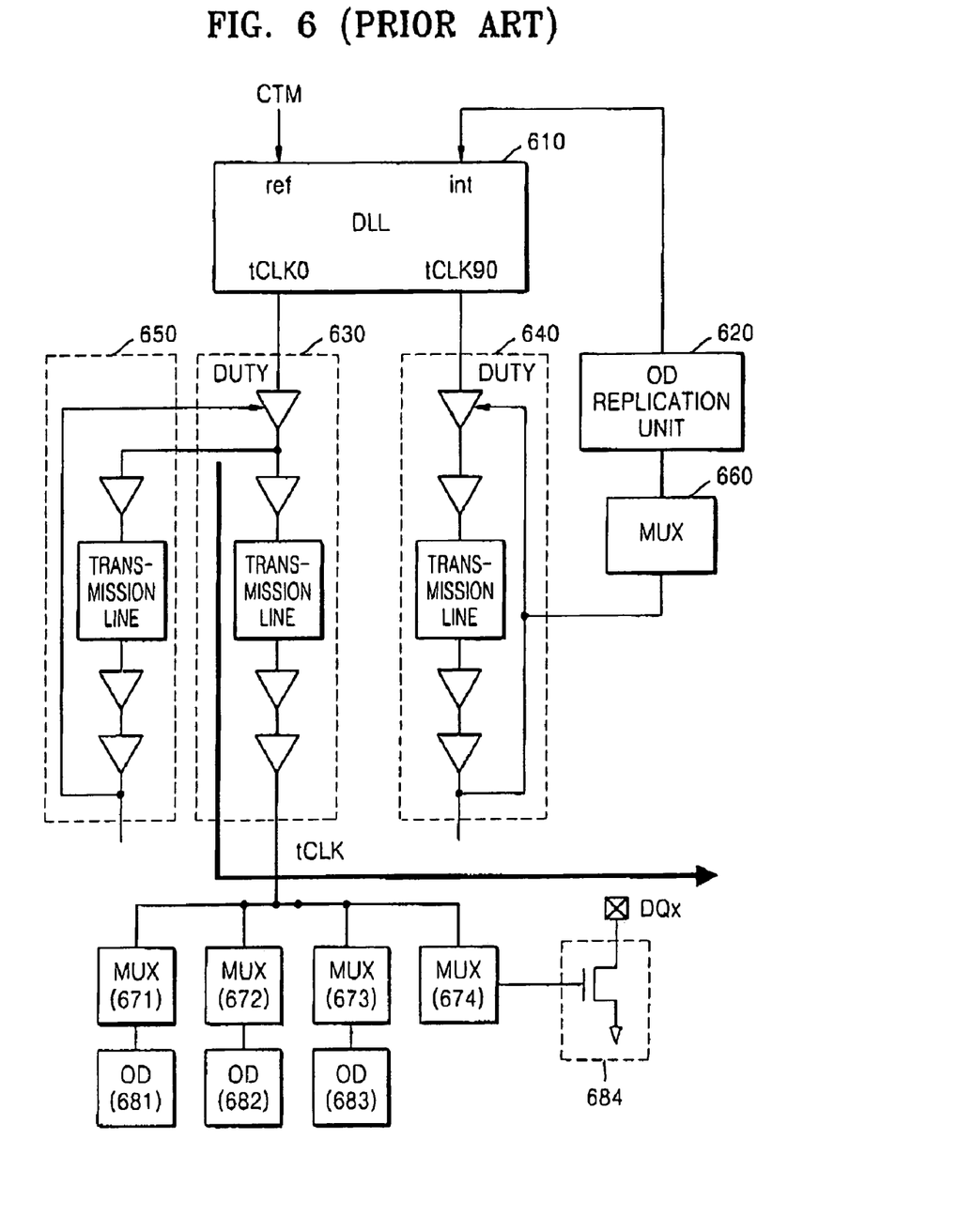
FIG. 6 is a diagram of a circuit for generating an output data signal in an RDRAM.

FIG. 6 is a diagram of a circuit for generating an output data signal in an RDRAM. Referring to FIG. 6, a DLL circuit 610 receives a CTM clock signal and a clock signal that is output from an output driver (OD) replication unit 620, and generates a tCLK0 clock signal and a tCLK90 clock signal that have a 90° phase difference between each other. The tCLK0 clock signal is changed into a tCLK clock signal while passing through a first path 630, and the tCLK clock signal drives output multiplexers (MUXs) 671, 672, 673, and 674. The tCLK90 clock signal passes through a second path 640, which is structured similarly to the first path 630, and is transmitted to the DLL circuit 610 via a MUX 660 and the OD replication unit 620, which compensates for time delays caused by buffers of, for example, the second path 640 and ODs, for example, ODs 681, 682 and 683. The duty of the tCLK0 clock signal is controlled by a signal that is generated by a third path 650, which has the same structure as the first path 630, and the duty of the tCLK90 clock signal is controlled by a signal that is generated by the second path 640.

Output data DQx, which is switched by the tCLK clock signal and generated by, for example, the MUX 674 and an output driver 684, is output in synchronization with a clock signal that has a 90° phase difference from the CTM clock signal. Hence, the middle points of the output data DQx are aligned with the edges of the CTM clock signal.

Figure 7:
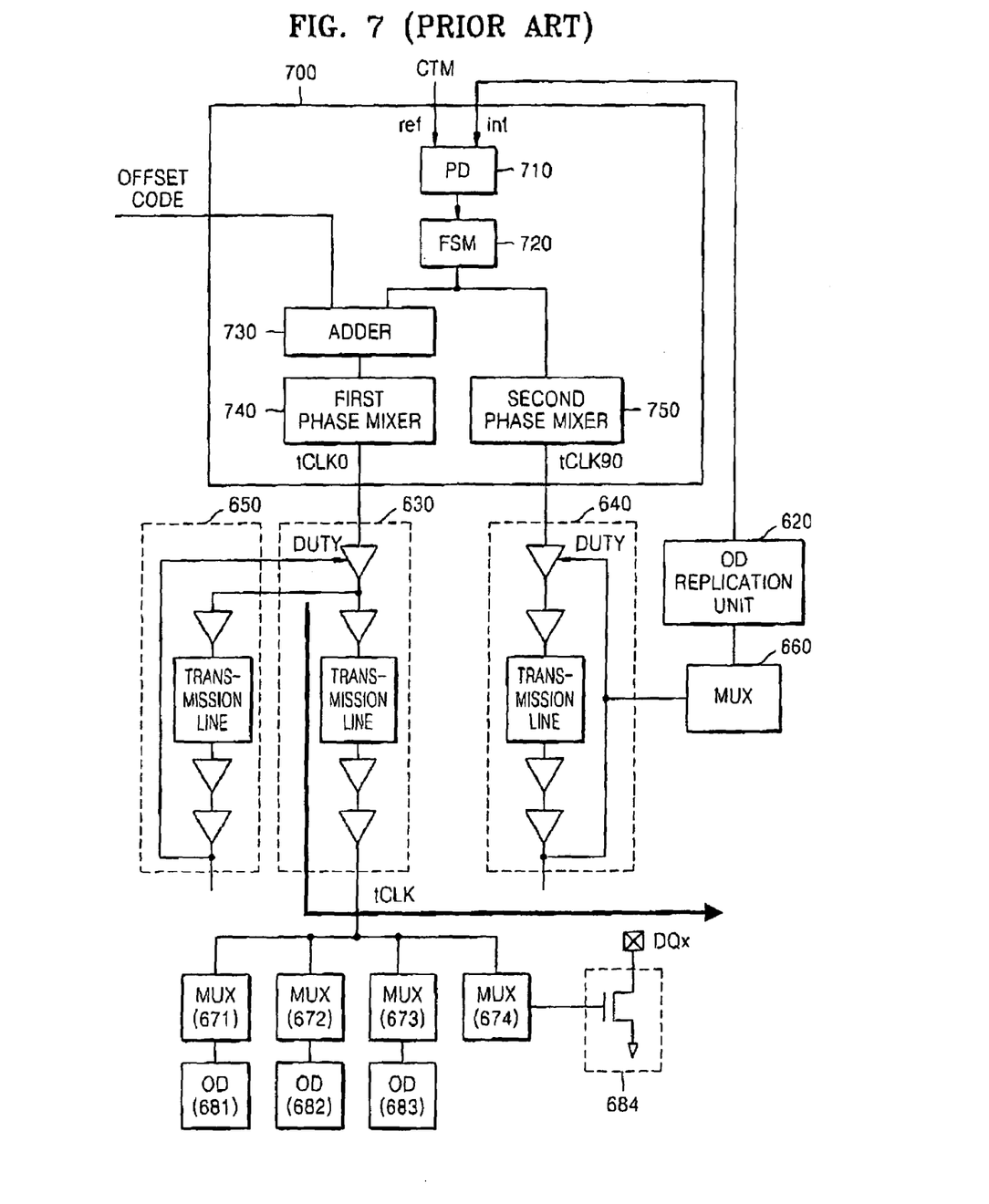
FIG. 7 is a block diagram showing a Hasting delay locked loop (DLL) circuit.

However, the output data DQx and the CTM clock signal may not have an exact 90° phase difference between each other, due to a difference among the time delays generated by, among others, a buffer, an interconnection line of, for example, the first, second and third paths 630, 640, and 650, the OD replication unit 620, a difference between signal paths, and a difference between the rates of dependence upon a process change. This inexact phase difference is referred to as a centering error between output data and a CTM clock signal. A Hasting DLL circuit 700, as shown in FIG. 7, is typically used to compensate for the centering error.

The Hasting DLL circuit 700 includes a phase detector (PD) 710, a final state machine (FSM) 720, an adder 730, and first and second phase mixers 740 and 750. The PD 710 detects a phase difference between the CTM clock signal and the clock signal that is output from the OD replication unit 620. The FSM 720 receives the output of the phase detector 710. The adder 730 receives the output of the FSM 720 and an offset code. The first phase mixer 740 generates the tCLK0 clock signal in response to the output of the adder 730, and the second phase mixer 750 generates the tCLK90 clock signal in response to the output of the FSM 720.

The offset code corresponds to a centering error between the CTM clock signal and the output data DQx and is offset by being added to the tCLK0 clock signal used as a timing signal for generation of the output data DQx. However, the offset code creates an additional process of searching for an optimal offset code value by communicating between a controller and an RDRAM.

Hence, there is a need for a method of determining an offset code with an RDRAM which monitors its output data and compares the phase of the output data with that of a CTM clock signal without communicating between a controller and the RDRAM.

SUMMARY OF THE INVENTION

According to one aspect of the present invention, there is provided a circuit for compensating for a skew between an output data signal and an external clock signal. The circuit comprises a phase detector (PD), an up-down counter, a delay locked loop (DLL) circuit, and an output driver (OD). The PD detects a phase difference between the output data signal and the external clock signal and generates an up signal or a down signal depending on the detected phase difference. The up-down counter is enabled by a calibration signal that directs a compensation of the skew, and generates an offset code in response to the up signal or the down signal. The DLL circuit receives the offset code in response to the calibration signal and generates first and second clock signals having first and second phase differences, respectively, from the external clock signal. The OD generates the output data signal in response to the first clock signal.

According to another aspect of the present invention, the first and second phase differences are 0° and 90°, respectively. The DLL circuit comprises a PD, a state machine, first and second adders, and first and second phase mixers. The PD of the DLL detects a phase difference between the external clock signal and the second clock signal. The state machine controls a delay in response to the phase difference detected by the PD of the DLL. The first adder receives an offset code from the up-down counter in response to the calibration signal. The second adder receives the output of the first adder and the output of the state machine. The first phase mixer generates the first clock signal in response to the output of the second adder. The second phase mixer generates the second clock signal in response to the output of the state machine.

According to yet another aspect of the present invention, there is provided a memory device for compensating for a skew between an output data signal and an external clock signal. The memory device comprises a PD, an up-down counter, a DLL circuit, first and second paths, an output driver, and an output driver replicator. The PD detects a phase difference between the output data signal and the external clock signal and generates an up signal or a down signal depending on the detected phase difference. The up-down counter is enabled by a calibration signal that directs a compensation of the skew, and generates an offset code in response to the up signal or the down signal. The DLL circuit receives the offset code in response to the calibration signal and generates first and second clock signals having first and second phase differences, respectively, from the external clock signal. The output driver is toggled by the first clock signal to generate the output data signal in response to the calibration signal. The output driver replicator receives the second clock signal, and feeds the second clock signal to the DLL circuit.

According to another aspect of the present invention, there is provided a method of compensating for a skew between an output data signal and an external clock signal. In this method, a phase difference between the output data signal and the external clock signal is detected, and an up signal or a down signal is generated depending on the detected phase difference. Next, an offset code is generated in response to the up signal or the down signal and a calibration signal that directs a compensation of the skew. Thereafter, first and second clock signals having first and second phase differences, respectively, are generated from the external clock signal by a DLL circuit. Then, a phase difference between the external clock signal and the second clock signal is detected. Then, a delay is controlled in response to the detected phase difference. Thereafter, the offset code is received in response to the calibration signal and the first and second clock signals are generated.

According to yet another aspect of the present invention, there is provided a method of compensating for a skew between an output data signal and an external clock signal using a memory device. In this method, first and second clock signals having first and second phase differences, respectively, are generated from the external clock signal. Next, a phase difference between the output data signal and the external clock signal is detected, and an up signal or a down signal is generated depending on the detected phase difference. Thereafter, a calibration signal that directs a compensation of the skew is activated to generate an offset code in response to the up or down signal. Then, the offset code is received in response to the activated calibration signal to align edges of the first clock signal with edges of the output data signal, which is toggled by the first clock signal. Then, the offset code is reset in response to the inactivation of the calibration signal. Finally, edges of the external clock signal are aligned with the middle points of the output data signal in response to the resetting of the offset code. Thus, allowing the offset code to be generated without communicating between a controller and a memory device.

BRIEF DESCRIPTION OF THE DRAWINGS

The above features of the present invention will become more apparent by describing in detail exemplary embodiments thereof with reference to the attached drawings, in which.

DETAILED DESCRIPTION OF EXEMPLARY EMBODIMENTS

Figure 8:
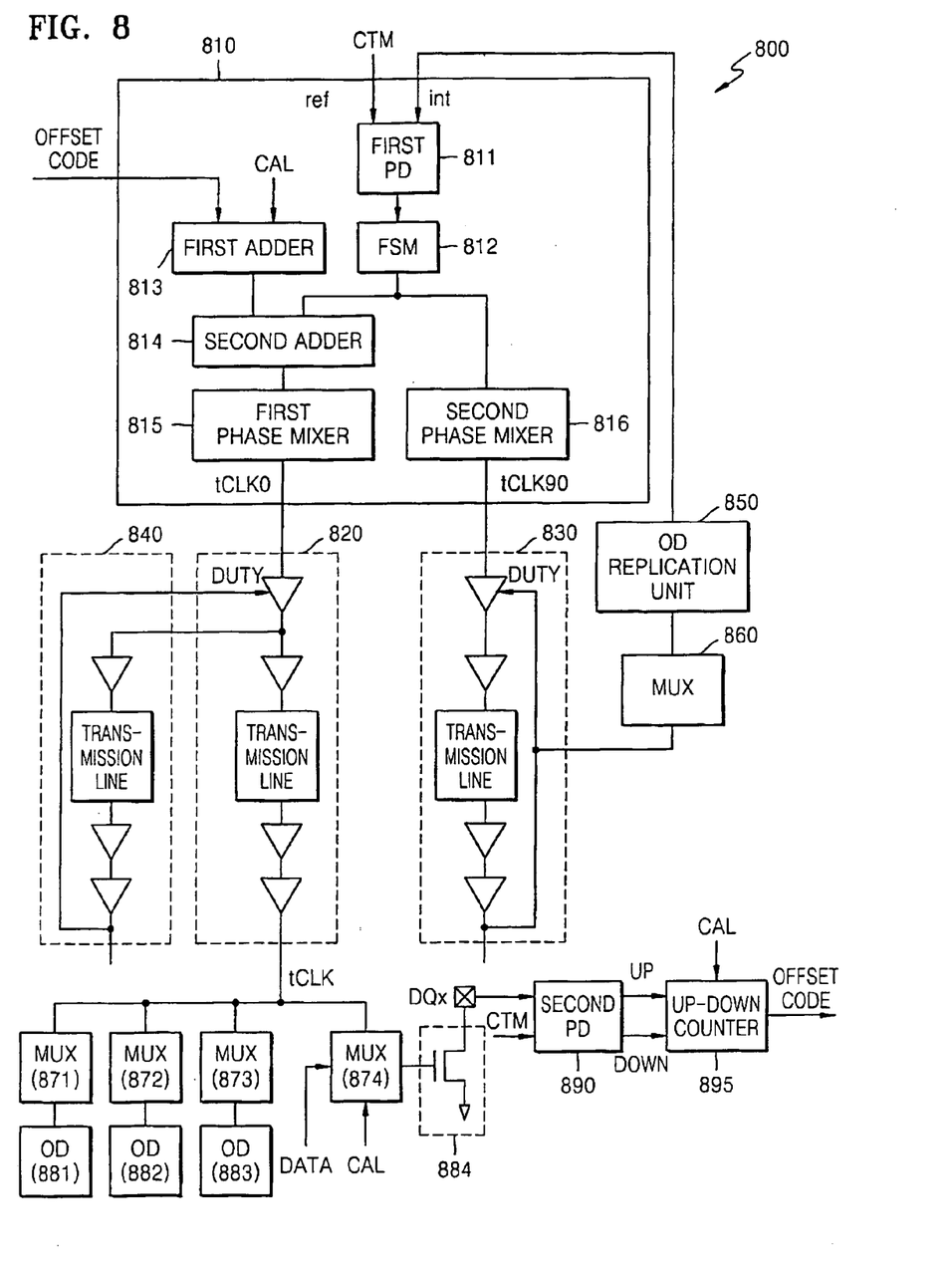
FIG. 8 is a block diagram showing a memory device according to an exemplary embodiment of the present invention.

Referring to FIG. 8, a memory device 800 according to an exemplary embodiment of the present invention includes a delay locked loop (DLL) circuit 810, first, second, and third paths 820, 830, and 840, an output driver (OD) replication unit 850, multiplexers (MUXs) 860, 871, 872, 873, and 874, ODs 881, 882, 883, and 884, a second phase detector (PD) 890, and an up-down counter 895.

The DLL circuit 810 includes a first PD 811, a final state machine (FSM) 812, first and second adders 813 and 814, and first and second phase mixers 815 and 816. The first PD 811 detects a phase difference between a clock-to-master (CTM) clock signal and a clock signal that is output from the OD replication unit 850. The FSM 812 responds to the output of the first PD 811. The first adder 813 receives a calibration signal CAL and an offset code from the up-down counter 895. The second adder 814 receives the output of the FSM 812 and the output of the first adder 813. The first phase mixer 815 generates a first clock signal tCLK0 in response to the output of the second adder 814. The second phase mixer 816 generates a second clock signal tCLK90 in response to the output of the FSM 812.

The first path 820 includes a physical transmission line via which the first clock signal tCLK0 generated by the DLL circuit 810 is provided to the MUXs 871, 872, 873, and 874, which are connected with the ODs 881, 882, 883, and 884. The first clock signal tCLK0 is changed to an internal clock signal tCLK while passing through the first path 820.

The second path 830 includes a physical transmission line similar to that of the first path 820, and receives a second clock signal tCLK90 and controls the duty of the second clock signal tCLK90 having a delay time generated by the physical transmission line of the second path 830.

The third path 840 includes a physical transmission line similar to that of the first path 820, and controls the duty of the first clock signal tCLK0 having a delay time that is generated while the first clock signal tCLK0 passes through the first path 820.

The second clock signal tCLK90 transmitted by the second path 830 is provided to the first PD 811 of the DLL circuit 810 via the MUX 860 and the OD replication unit 850. The MUX 860 and the OD replication unit 850 reflect load and delay time that are generated by the MUXs 871, 872, 873, and 874 and the ODs 881, 882, 883, 884, which are connected with the internal clock signal tCLK, in the second clock signal tCLK90, which is provided to the DLL circuit 810.

The internal clock signal tCLK toggles the MUXs 871, 872, 873, and 874, which are connected to the ODs 881, 882, 883, and 884. The MUXs 871, 872, 873, and 874 respond to the internal clock signal tCLK and internal data DATA that is output from an internal circuit block (not shown). The outputs of the MUXs 871, 872, 873, and 874 switch the ODs 881, 882, 883, and 884, respectively. The MUX 874 drives the OD 884 in response to the calibration signal CAL and outputs data to an output data pad DQx.

The OD 884 is a negative channel metal oxide semiconductor (NMOS) transistor whose gate is connected with the output of the MUX 874, source is connected with a ground voltage VSS, and drain is connected with the output data pad DQx. The output data pad DQx is connected with a termination resistance Rterm (not shown) and, externally connected to a termination voltage Vterm (not shown). The output data pad DQx initially has a logic high level, and the logic high level is changed to a logic low level when the OD 884 is driven.

The second PD 890 detects a phase difference between data transmitted to the output data pad DQx and a CTM clock signal and generates an up signal UP or a down signal DOWN depending on the detected phase difference. The phase difference between the data of the output data pad DQx and the CTM clock signal denotes a centering error. The up-down counter 895 receives the up or down signal UP or DOWN and is enabled in response to the calibration signal CAL to generate an offset code. The offset code is provided to the first adder 813 included in the DLL circuit 810, so that a centering error between the data of the output data pad DQx and the CTM clock signal is fed directly back to the DLL circuit 810 and reflected in the generation of the first clock signal tCLK0.

Figure 9:
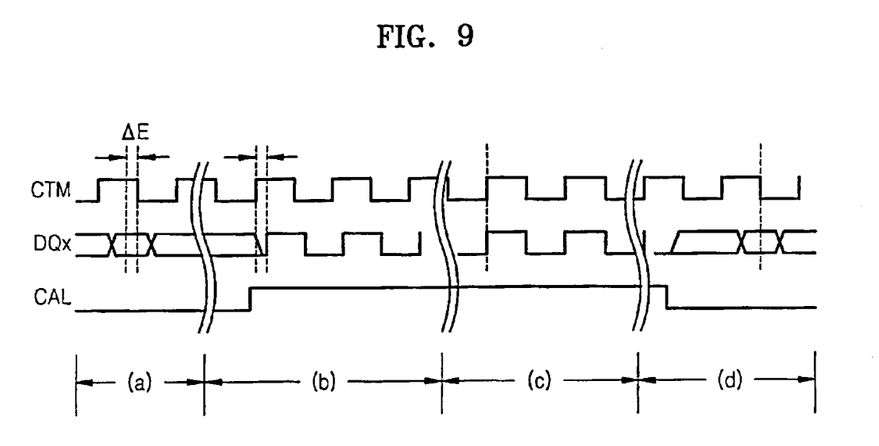
FIG. 9 is a timing diagram illustrating an operation of the memory device of FIG. 8.

An operation of the memory device 800 of FIG. 8 is illustrated in FIG. 9. Referring to FIG. 9, in case (a) where the calibration signal CAL is at a logic low level, data is toggled by the internal clock signal tCLK and transmitted to the output data pad DQx in response to internal data DATA. A centering error Δ E is generated between the CTM clock signal, which is a reference clock for generating the internal clock signal tCLK, and the data stored in the output data pad DQx.

In case (b) where the state of the calibration signal CAL changes from the logic low level to a logic high level, the output data pad DQx is toggled by the MUX 874, in response to the internal clock signal tCLK, the calibration signal CAL, and the OD 884. At this time, an up or down signal UP or DOWN is generated by the second PD 890, which detects a phase difference between the data of the output data pad DQx and the CTM clock signal. A predetermined offset code, for example, a 2-bit offset code, is generated by the up-down counter 895, which responds to the up or down signal UP or DOWN and the calibration signal CAL.

In case (c) where the calibration signal CAL is at a logic high level, the offset code is provided to the first adder 813 of the DLL circuit 810 so that the centering error between the data of the output data pad DQx and the CTM clock signal is reflected in the generation of the internal clock signal tCLK. Hence, the phase difference between the data of the output data pad DQx and the CTM clock signal is compensated for so that the data of the output data pad DQx, which is toggled by the internal clock signal tCLK, has the same phase as that of the CTM clock signal.

In case (d) where the state of the calibration signal CAL changes from the logic high level to the logic low level, the offset code of the up-down counter 895 is reset to, for example, "00". Accordingly, the DLL circuit 810 delays the first clock signal tCLK0 by exactly or substantially 90° and generates the 90°-delayed first clock signal tCLK0. Thus, an edge of the CTM clock signal, which is a reference signal for the first internal clock signal tCLK0, is aligned with the middle point of data carried in the output data pad DQx.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A circuit for compensating for a skew between an output data signal and an external clock signal, the circuit comprising:

a phase detector (PD) for detecting a phase difference between the output data signal and the external clock signal and for generating an up signal or a down signal depending on the detected phase difference;

an up-down counter enabled by a calibration signal that directs a compensation of the skew, for generating an offset code in response to the up signal or the down signal;

a delay locked loop (DLL) circuit for receiving the offset code in response to the calibration signal and for generating first and second clock signals having first and second phase differences, respectively, from the external clock signal; and an output driver (OD) for generating the output data signal in response to the first clock signal.

2. The circuit of claim 1, wherein the first and second phase differences are 0° and 90°, respectively.

3. The circuit of claim 2, wherein the DLL circuit comprises:

a PD for detecting a phase difference between the external clock signal and the second clock signal;

a state machine for controlling a delay in response to the phase difference detected by the PD of the DLL;

a first adder for receiving an offset code from the up-down counter in response to the calibration signal;

a second adder for receiving the output of the first adder and the output of the state machine;

a first phase mixer for generating the first clock signal in response to the output of the second adder; and a second phase mixer for generating the second clock signal in response to the output of the state machine.

4. A memory device for compensating for a skew between an output data signal and an external clock signal, the memory device comprising:

a phase detector (PD) for detecting a phase difference between the output data signal and the external clock signal and for generating an up signal or a down signal depending on the detected phase difference;

an up-down counter enabled by a calibration signal that directs a compensation of the skew, for generating an offset code in response to the up signal or the down signal;

a delay locked loop (DLL) circuit for receiving the offset code in response to the calibration signal and for generating first and second clock signals having first and second phase differences, respectively, from the external clock signal;

an output driver (OD) toggled by the first clock signal to generate the output data signal in response to the calibration signal; and an OD replicator for receiving the second clock signal and for sending the second clock signal to the DLL circuit.

5. The memory device of claim 4, wherein the first and second phase differences are 0° and 90°, respectively.

6. The memory device of claim 4, further comprising:

a first path including a transmission line via which the first clock signal travels;

a second path including a transmission line via which the second clock signal travels, wherein the second path controls a duty of the second clock signal; and a third path including a transmission line, wherein the third path controls a duty of the first clock signal.

7. The memory device of claim 4, further comprising:

a multiplexer (MUX) for controlling the OD in response to the first clock signal, the calibration signal and an internal data signal.

8. The memory device of claim 4, wherein the DLL circuit comprises:

a phase detector (PD) for receiving the external clock signal and the output of the OD replicator and for detecting a phase difference between the external clock signal and the output of the OD replicator;

a state machine for controlling a delay in response to the phase difference detected by the PD of the DLL;

a first adder for receiving an offset code from the up-down counter in response to the calibration signal;

a second adder for receiving the output of the first adder and the output of the state machine;

a first phase mixer for generating the first clock signal in response to the output of the second adder; and a second phase mixer for generating the second clock signal in response to the output of the state machine.

9. The memory device of claim 8, wherein the offset code is provided to the first adder so that a centering error between the external clock signal and the output data signal are reflected in the first clock signal.

10. A method of compensating for a skew between an output data signal and an external clock signal, the method comprising:

detecting a phase difference between the output data signal and the external clock signal and generating an up signal or a down signal depending on the detected phase difference;

generating an offset code in response to the up signal or the down signal and a calibration signal that directs a compensation of the skew;

generating first and second clock signals having first and second phase differences, respectively, from the external clock signal, by using a delay locked loop (DLL) circuit;

detecting a phase difference between the external clock signal and the second clock signal;

controlling a delay in response to the detected phase difference; and receiving the offset code in response to the calibration signal and generating the first and second clock signals.

11. The method of claim 10, wherein the first and second phase differences are 0° and 90°, respectively.

12. A method of compensating for a skew between an output data signal and an external clock signal using a memory device, the method comprising:

generating first and second clock signals having first and second phase differences, respectively, from the external clock signal;

detecting a phase difference between the output data signal and the external clock signal and generating an up signal or a down signal depending on the detected phase difference;

activating a calibration signal that directs a compensation of the skew and generating an offset code in response to the up or down signal;

receiving the offset code in response to the activated calibration signal and aligning edges of the first clock signal with edges of the output data signal, which is toggled by the first clock signal;

resetting the offset code in response to the inactivation of the calibration signal; and aligning edges of the external clock signal with the middle points of the output data signal in response to the resetting of the offset code.

13. The method of claim 12, wherein the first and second phase differences are 0° and 90°, respectively.

14. The method of claim 12, wherein the memory device comprises:

a phase detector (PD); and an up-down counter, wherein the PD and the up-down counter generate the offset code, wherein the offset code corresponds to the clock skew.

* * * * *